(12) United States Patent
Song

(10) Patent No.: US 11,705,851 B2
(45) Date of Patent: Jul. 18, 2023

(54) OPEN CIRCUIT DIAGNOSIS APPARATUS AND METHOD FOR MOTOR DRIVE CIRCUIT

(71) Applicant: VITESCO TECHNOLOGIES GMBH, Hannover (DE)

(72) Inventor: Dongsung Song, Munich (DE)

(73) Assignee: Vitesco Technologies GmbH, Hannover (DE)

( * ) Notice: Subject to any disclaimer, the term of this patent is extended or adjusted under 35 U.S.C. 154(b) by 20 days.

(21) Appl. No.: 17/475,887

(22) Filed: Sep. 15, 2021

(65) Prior Publication Data

US 2022/0006416 A1    Jan. 6, 2022

Related U.S. Application Data

(63) Continuation-in-part of application No. PCT/EP2020/058447, filed on Mar. 26, 2020.

(30) Foreign Application Priority Data

Mar. 27, 2019   (KR) .................. 10-2019-0035130

(51) Int. Cl.
*H02P 29/024* (2016.01)
*H02P 7/03* (2016.01)
*G01R 19/165* (2006.01)

(52) U.S. Cl.
CPC ...... *H02P 29/024* (2013.01); *G01R 19/16519* (2013.01); *G01R 19/16571* (2013.01); *H02P 7/04* (2016.02)

(58) Field of Classification Search
CPC ... H02P 29/024; H02P 7/04; G01R 19/16519; G01R 19/16571

USPC ................. 318/400.21, 400.01, 700
See application file for complete search history.

(56) References Cited

U.S. PATENT DOCUMENTS

| | | | |
|---|---|---|---|
| 5,592,097 A | 1/1997 | Shimizu et al. | |
| 6,794,880 B2 | 9/2004 | Tucker | |
| 7,548,070 B2 | 6/2009 | Foerster et al. | |
| 8,248,010 B2 * | 8/2012 | Mukai | H02P 29/0241 318/400.29 |
| 8,351,168 B2 * | 1/2013 | Sicard | H03K 17/687 340/648 |

(Continued)

FOREIGN PATENT DOCUMENTS

| | | |
|---|---|---|
| JP | 3203521 B2 | 8/2001 |
| JP | 4155075 B2 | 9/2008 |

(Continued)

*Primary Examiner* — David Luo
(74) *Attorney, Agent, or Firm* — Laurence A. Greenberg; Werner H. Stemer; Ralph E. Locher

(57) ABSTRACT

An open circuit diagnosis apparatus, and method for open circuit diagnosis, for a motor drive circuit with a Miller plateau detection unit that detects whether there is a Miller plateau region in a gate voltage applied to a switching element of a motor drive circuit when the switching element is turned on; a body diode activation detection unit which detects whether the body diode of the switching element has been activated which depends on the on/off state of the switching element; and a control unit which determines whether the motor drive circuit is in the open circuit state on the basis of whether the body diode activation unit has been activated and whether there is a Miller plateau region in a gate voltage.

15 Claims, 5 Drawing Sheets

(56) References Cited

U.S. PATENT DOCUMENTS

| | | | |
|---|---|---|---|
| 8,878,474 B2* | 11/2014 | Kezobo | ............... B62D 5/0403 |
| | | | 318/434 |
| 9,825,625 B2 | 11/2017 | Thalheim | |
| 9,912,220 B2 | 3/2018 | Deboy | |
| 10,574,226 B2* | 2/2020 | Narayanasamy | ........................... |
| | | | H03K 17/08142 |
| 2014/0333320 A1 | 11/2014 | Bametova | |
| 2018/0234088 A1 | 8/2018 | Narayanasamy et al. | |

FOREIGN PATENT DOCUMENTS

| | | |
|---|---|---|
| JP | 4225988 B2 | 2/2009 |
| KR | 101206885 B1 | 11/2012 |
| KR | 20140103166 A | 8/2014 |
| KR | 1020160089284 A | 7/2016 |
| KR | 101787273 B1 | 10/2017 |
| KR | 101916795 B1 | 11/2018 |

\* cited by examiner

OPEN CIRCUIT DIAGNOSIS APPARATUS AND METHOD FOR MOTOR DRIVE CIRCUIT

CROSS-REFERENCE TO RELATED APPLICATION

This application is a continuation-in-part, under 35 U.S.C. § 120, of international application No. PCT/EP2020/058447, filed Mar. 26, 2020, which designated the United States; this application also claims the priority, under 35 U.S.C. § 119, of the Republic of Korea, patent application No. KR 10-2019-0035130, filed Mar. 27, 2019; the prior applications are herewith incorporated by reference in their entirety.

FIELD AND BACKGROUND OF THE INVENTION

The present invention relates to an open circuit diagnosis apparatus and method for a motor drive circuit, and more specifically relates to an open circuit diagnosis apparatus and method for a motor drive circuit, said apparatus being capable of detecting an open circuit of a motor drive circuit during operation of the motor.

In general, full bridge (or H-bridge) motor drive circuits are used in order to drive direct-current motors which are used in vehicles etc. in the forward direction or reverse direction.

In such an instance, it is important to detect an open circuit of the motor drive circuit, even during operation of the direct-current motor, but in the prior art, it has not been possible to diagnose an open circuit during operation of the motor for technical reasons, and so open circuit diagnosis has been performed only when the power terminal was OFF. But sensing open circuits in real time has become important as motor application in safety-critical areas of a vehicle increases.

Consequently, indirect diagnostic methods have been used in the prior art, such as checking motor position feedback in order to diagnose an open circuit in the motor drive circuit during motor operation, however there are problems in that this takes a long time compared to open circuit diagnosis performed in the motor drive circuit.

Consequently, there is a need for an apparatus capable of performing open circuit diagnosis in a motor drive circuit quickly and safely even during motor operation.

SUMMARY OF THE INVENTION

The background art of the present invention is described in Korean Registered Patent No. 10-1787273 (Registered Oct. 11, 2017, MOTOR DRIVING APPARATUS AND METHOD FOR DETECTING DISCONNECTION OF WIRE OF THE SAME).

According to one aspect of the present invention, the present invention has been devised in order to solve problems such as the one described above, and the object of the present invention is to provide an open circuit diagnosis apparatus and method for a motor drive circuit, said apparatus being capable of detecting an open circuit of the motor drive circuit during operation of the motor.

An open circuit diagnosis apparatus for a motor drive circuit according to one aspect of the present invention is characterized by comprising: a Miller plateau detection unit which detects whether there is a Miller plateau region in a gate voltage applied to a switching element of a motor drive circuit when the switching element is turned on; a body diode activation detection unit which detects whether the body diode of the switching element has been activated which depends on the on/off state of the switching element; and a control unit which determines whether the motor drive circuit is in the open circuit state on the basis of whether the body diode activation unit has been activated and whether there is a Miller plateau region in the gate voltage.

A characterizing feature in the present invention is that the control unit determines that the motor drive circuit is in the open circuit state, when the body diode activation detection unit is in the deactivated state and at the same time there is no Miller plateau region in the gate voltage.

In the present invention, the Miller plateau detection unit is characterized by comprising: a first comparator which detects the voltage difference between the gate and the source of the switching element; a second comparator which compares the output level of the first comparator with a predetermined first threshold value Vth1; a third comparator which compares the output level of the first comparator with a predetermined second threshold value Vth2; and an XOR operation unit which receives input of the output values of the second and third comparators so as to determine and output an exclusive OR logic operation XOR.

A characterizing feature in the present invention is that the Miller plateau region is a voltage waveform region in which there is a gate voltage V2 when the switching element is turned on, when there is an open circuit between the switching element and the motor load.

A characterizing feature in the present invention is that the Miller plateau detection unit is a circuit which outputs a pulse Tplateau that corresponds to the times at which the predesignated upper/lower threshold values Vth2, Vth1 of the Miller plateau region are detected.

A characterizing feature in the present invention is that, when there is an open circuit between the switching element and the motor load, there is no Miller plateau region in the gate voltage V2 when the switching element is turned on, and consequently the Miller plateau detection unit outputs a pulse in which the width of the pulse Tplateau which corresponds with the times at which the predesignated upper/lower threshold values Vth2, Vth1 are detected is narrower than a predesignated value.

A characterizing feature in the present invention is that the upper/lower threshold values Vth2, Vth1 are values that are set to correspond with the Miller plateau region which depends on the type of switching element.

A characterizing feature in the present invention is that the control unit determines the state to be the normal state in which there is not an open circuit, when the width of the pulse Tplateau output from the Miller plateau detection unit is the same as the width of a predesignated pulse within an error range, and determines the state to be the open circuit state, when the width of the pulse Tplateau output from the Miller plateau detection unit is narrower than the width of the predesignated pulse.

A characterizing feature in the present invention is that the body diode activation detection unit is for detecting the activation of a diode formed between the source and the drain of the switching element, and comprises: a fourth comparator which detects the voltage difference between the source and the drain; and a fifth comparator which compares the output level of the fourth comparator with a predetermined reference value Vref and outputs the results of the comparison.

A characterizing feature in the present invention, the control unit may be implemented as a software-based Miller plateau detection unit and the software-based Miller plateau detection unit comprises: an AD converter which continually receives input of the gate voltage of the switching element of the motor drive circuit and converts same into digital; and a comparator which shapes a signal which is continually output from the AD converter, and determines whether there is an open circuit by comparing the form of the signal shaped by the comparator and a pre-stored graph form of the gate voltage of the switching element.

An open circuit diagnosis method for a motor drive circuit according to another aspect of the present invention is characterized by comprising steps in which: when turning on the switching element of the motor drive circuit by applying a gate control signal to the switching element, the control unit checks whether the pulse width of the output signal of the Miller plateau detection unit is smaller than a preset threshold value; if the checking result is that the pulse width of the output signal of the Miller plateau detection unit is smaller than the preset threshold value, the control unit checks whether the body diode activation detection unit is in the deactivated state; and when the pulse width of the output signal of the Miller plateau detection unit is smaller than the preset threshold value and the body diode activation detection unit is in the deactivated state, the control unit determines that the motor drive circuit is in the open circuit state.

The present invention is characterized by further comprising a step in which: when the pulse width of the output signal of the Miller plateau detection unit is not smaller than the preset threshold value, the control unit determines that the motor drive circuit is in the normal state.

The present invention is characterized by further comprising a step in which: when the body diode activation detection unit is in the activated state even though the pulse width of the output signal of the Miller plateau detection unit is smaller than the preset threshold value, the control unit determines that the open circuit diagnosis of the motor drive circuit is still in an incomplete state.

According to one aspect of the present invention, the present invention is capable of detecting an open circuit of a motor drive circuit during operation of the motor.

Other features which are considered as characteristic for the invention are set forth in the appended claims.

Although the invention is illustrated and described herein as embodied in open circuit diagnosis apparatus and method for motor drive circuit {apparatus and method for detecting open circuit of motor drive circuit}, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
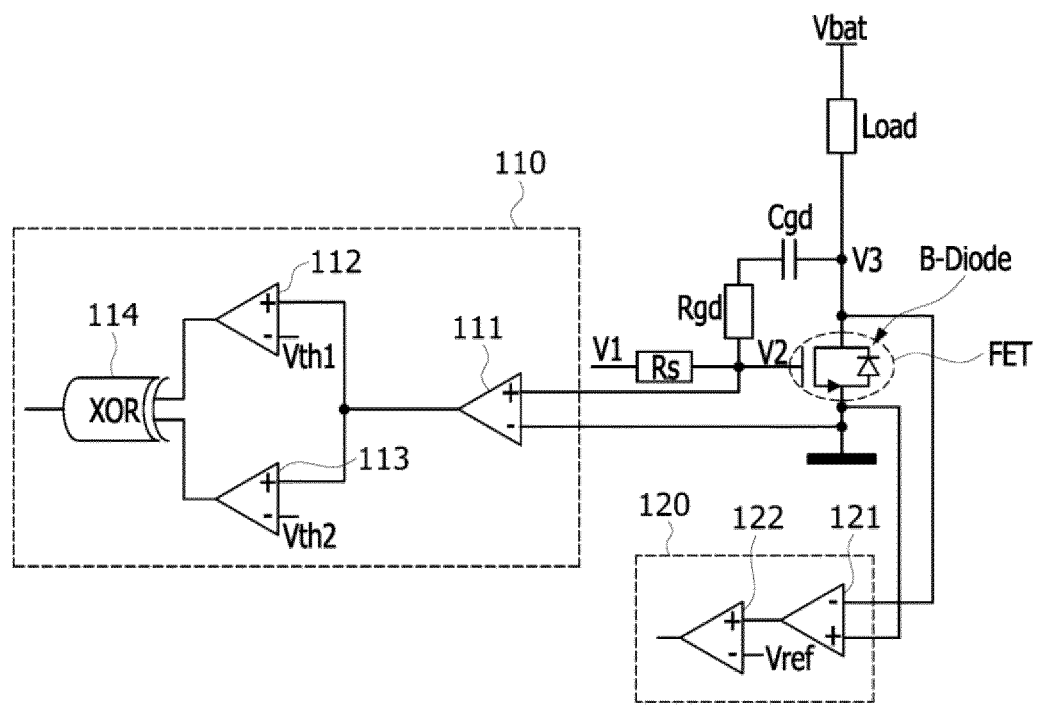
FIG. 1 is an illustration showing a schematic configuration of an open circuit diagnosis apparatus for a motor drive circuit according to one embodiment of the present invention.

Hereinafter, the open circuit diagnosis apparatus and method for a motor drive circuit according to the present invention will be described with reference to the accompanying drawings.

In this context, the thickness of lines or the size of the components shown in the drawings may be exaggerated for clarity of the description and convenience. In addition, the following terms are defined in relation to their functions in the present invention and can vary depending on the intention of the user or operator, or on customary practice. Thus, definitions of such terms should be made based on the contents throughout this specification.

FIG. 1 is an illustration showing a schematic configuration of an open circuit diagnosis apparatus for a motor drive circuit according to one embodiment of the present invention.

As shown in FIG. 1, the open circuit diagnosis apparatus for a motor drive circuit according to the present embodiment comprises a Miller plateau detection unit 110 and a body diode activation detection unit 120.

The Miller plateau detection unit 110 comprises: a first comparator 111 which detects the voltage difference between the gate and the source of a switching element; a second comparator 112 which compares the output level of the first comparator 111 with a predetermined first threshold value Vth1 and outputs same; a third comparator 113 which compares the output level of the first comparator 111 with a predetermined second threshold value Vth2 and outputs same; and an XOR operation unit 114 which receives input of the output values of the second and third comparators 112,113 so as to determine and output an exclusive OR logic operation XOR. The switching element comprises a transistor (e.g. FET, MOSFET, Insulated Gate Bipolar Transistor (IGBT)).

Figure 2A:
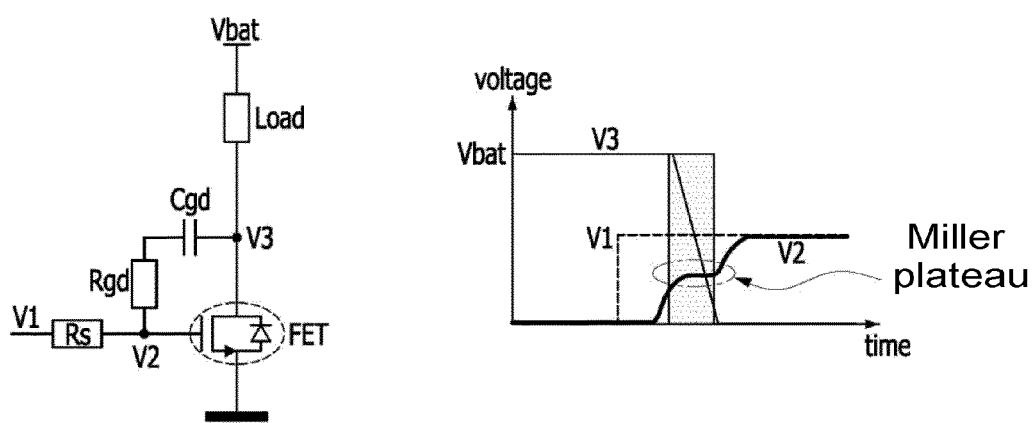
FIG. 2A is an illustration showing the voltage waveform detected at each node of the switching element in the normal state when the switching element of the motor drive circuit is turned on, with respect to FIG. 1.
Figure 2B:
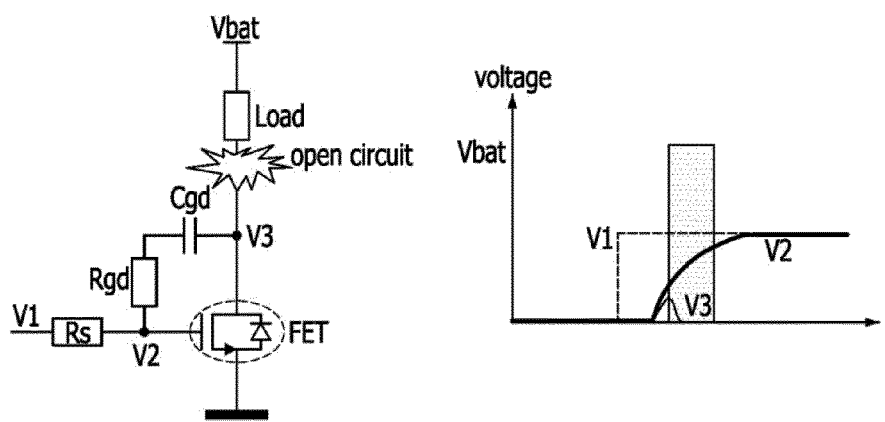
FIG. 2B is an illustration showing the voltage waveform detected at each node of the switching element in the open circuit state when the switching element of the motor drive circuit is turned on, with respect to FIG. 1.

FIGS. 2A and 2B are illustrations showing the voltage waveform detected at each node of the switching element in the normal state or the open circuit state when the switching element of the motor drive circuit is turned on, with respect to FIG. 1. FIG. 2A is an illustration showing the voltage waveform detected at each node of the switching element when the motor drive circuit in the normal state is turned on, and FIG. 2B is an illustration showing the voltage waveform detected at each node of the switching element when the motor drive circuit in the open circuit state is turned on. The switching element comprises a transistor (e.g. FET, MOSFET, Insulated Gate Bipolar Transistor (IGBT)).

With reference to FIG. 2A, there is a Miller plateau region in the gate voltage V2 when the switching element is turned on when in the normal state in which there is not an open circuit between the switching element and the load (motor). On the other hand, with reference to FIG. 2B, there is not a Miller plateau region in the gate voltage V2 when the switching element is turned on when in the open circuit state in which there is an open circuit between the switching element and the load (motor). The switching element comprises a transistor (e.g. FET, MOSFET, Insulated Gate Bipolar Transistor (IGBT)).

Accordingly, the Miller plateau detection unit 110 detects whether there is a Miller plateau region in the gate voltage V2 when the switching element is turned on and outputs the result.

Figure 3A:
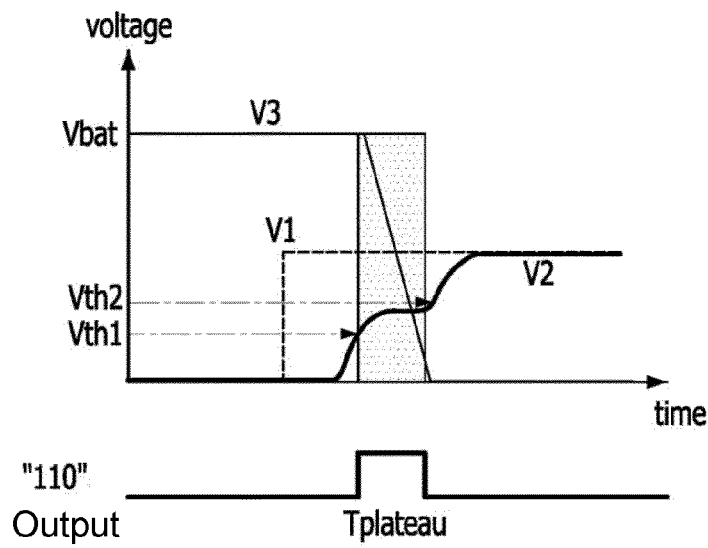
FIG. 3A is an illustration showing the pulse waveform output from the Miller plateau detection unit in a normal state, with respect to FIG. 1.
Figure 3B:
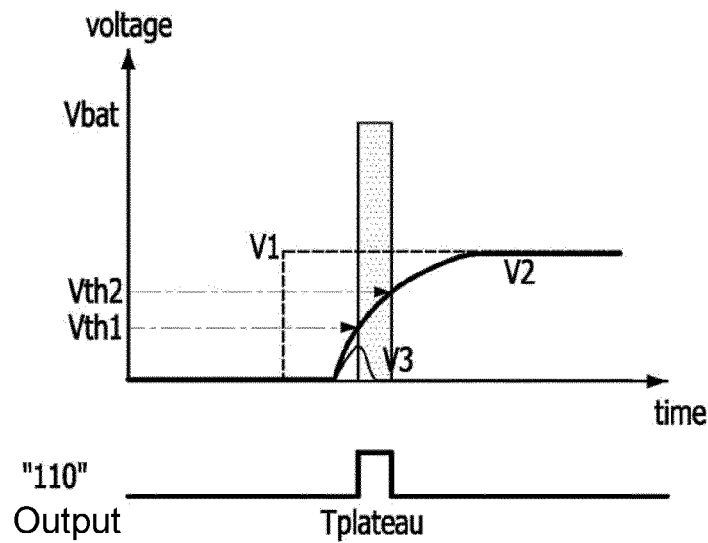
FIG. 3B is an illustration showing the pulse waveform output from the Miller plateau detection unit in an open circuit state, with respect to FIG. 1.

FIGS. 3A and 3B are illustrations showing the pulse waveform output from the Miller plateau detection unit, with respect to FIG. 1, wherein the pulse Tplateau output from the Miller plateau detection unit 110 is a pulse Tplateau which corresponds with the times at which the predesignated upper/lower threshold values (i.e. the upper/lower voltage levels of the Miller plateau region) Vth2, Vth1 of the Miller plateau region are detected.

For instance, with reference to FIG. 3A, when the state is the normal state in which there is not an open circuit between the switching element (e.g. transistor, FET, MOSFET, IGBT) and load (motor), there is a Miller plateau region in the gate voltage V2 when the switching element is turned on, and consequently the width of the pulse Tplateau which corresponds with the times at which the predesignated upper/lower threshold values Vth1, Vth2 are detected has a predesignated value within the error range.

On the other hand, with reference to FIG. 3B, when the state is the open circuit state in which there is an open circuit between the switching element (e.g. FET, MOSFET, IGBT) and load (motor), there is not a Miller plateau region in the gate voltage V2 when the switching element is turned on, and consequently the width of the pulse Tplateau which corresponds with the times at which the predesignated upper/lower threshold values Vth1, Vth2 are detected is narrower than the predesignated value.

In this instance, the upper/lower threshold values Vth1, Vth2 are values set to correspond to the Miller plateau region which depends on the type of switching element (e.g. FET, MOSFET, IGBT).

That is to say, the first comparator 111 receives input of the gate and source voltages of the switching element (e.g. FET, MOSFET, IGBT) and outputs the gate voltage (i.e. V2 voltage) which is a positive+voltage when the switching element is turned on. The second comparator 112 outputs a low signal until the gate voltage (i.e. V2 voltage) output by the first comparator 111 becomes greater than the predetermined first threshold value Vth1 and then outputs a high signal when the gate voltage becomes greater than the predetermined first threshold value Vth1, and, at this time, the XOR operation unit 114 outputs a rising pulse signal. Meanwhile, the third comparator 113 outputs a low signal until the gate voltage (i.e. V2 voltage) output by the first comparator 111 becomes greater than the predetermined second threshold value Vth2 and then outputs a high signal when the gate voltage becomes greater than the predetermined second threshold value Vth2, and, at this time, the XOR operation unit 114 outputs a falling pulse signal according to the XOR logic operation since the outputs from the second and third comparators 112, 113 are both high.

Accordingly, the state is determined to be the normal state in which there is no open circuit, when the width of the pulse Tplateau (i.e. the width of the pulse in the high region output from the Miller plateau detection unit 110 is the same as the width of the predesignated pulse within the error range, whilst the state is determined to be the open circuit state, when the width of the pulse Tplateau (i.e. the width of the pulse in the high region) output from the Miller plateau detection unit 110 is narrower (or smaller) than the width of the predesignated pulse.

In this instance, the Miller plateau detection unit 110 according to the present embodiment is for detecting an open circuit of a motor drive circuit during operation of the motor (i.e. when the switching element is turned on), and thus, in the OFF state of the switching element, there is no need to detect an open circuit of the motor drive circuit. Accordingly, the body diode activation detection unit 120 detects whether the switching element is in the OFF state on the basis of whether the body diode B-diode has been activated. For example, when the switching element is in the ON state, the body diode B-diode is in the deactivated state, whilst when the switching element is in the OFF state, the body diode B-diode is in the activated state.

The body diode activation detection unit 120 is for detecting the activation of a diode (i.e. body diode, B-diode) formed between the source and the drain of the switching element (e.g. FET, MOSFET, IGBT), and comprises: a fourth comparator 121 which detects the voltage difference between the source and the drain; and a fifth comparator 122 which compares the output level of the fourth comparator 121 with a predetermined reference value Vref and outputs the result.

When a reverse current flows through the body diode B-diode while the switching element (e.g. FET, MOSFET, IGBT) is OFF, the body diode activation detection unit 120 outputs a signal having a corresponding level (low or high level).

Figure 4:
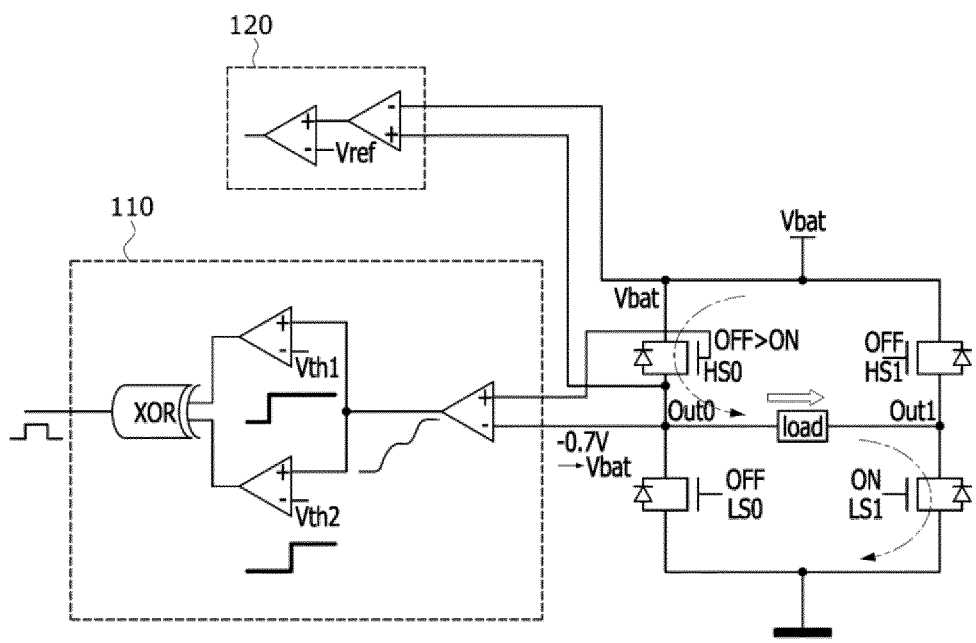
FIG. 4 is an illustration showing the open circuit diagnosis apparatus for a motor drive circuit according to one embodiment of the present invention connected to a full-bridge type of motor drive circuit in order to explain the method for detecting an open circuit.

FIG. 4 is an illustration showing the open circuit diagnosis apparatus for a motor drive circuit according to one embodiment of the present invention connected to a full-bridge type of motor drive circuit in order to explain the method for detecting an open circuit.

Here, the form of connection of each terminal of the open circuit diagnosis apparatus for a motor drive circuit shown in FIG. 1 and FIG. 4 are drawn in an illustrative manner to aid understanding of the present invention, and therefore it should be noted that the form of connection of the terminals may be changed in other embodiments.

With reference to FIG. 4, it is assumed that a changeover take place from a state in which the motor (load) rotates in a first direction by means of a current flowing in response to the two switching elements HS0, LS1 both being turned on, to a freewheel state in which the upper switching element HS0 of the two switching elements is turned off. Here, when the motor (load) rotates in the first direction, the body diode B-diode of the switching element HS0 is in the deactivated state, whilst in the freewheel state, the body diode B-diode of the switching element HS0 is in the activated state due to the reverse current.

Accordingly, when the body diode B-diode of the switching element HS0 is in the deactivated state, the state can be diagnosed through the body diode activation detection unit 120 as the open circuit state, when the width of the pulse output through the Miller plateau detection unit 110 is narrower (or smaller) than a predesignated value.

Here, the signals (or pulse signal) output from the Miller plateau detection unit 110 and the body diode activation detection unit 120 can be input into a microcomputer 200 or control unit, and consequently the microcomputer 200 can diagnose an open circuit of the motor drive circuit by combining the two signals.

Figure 5:
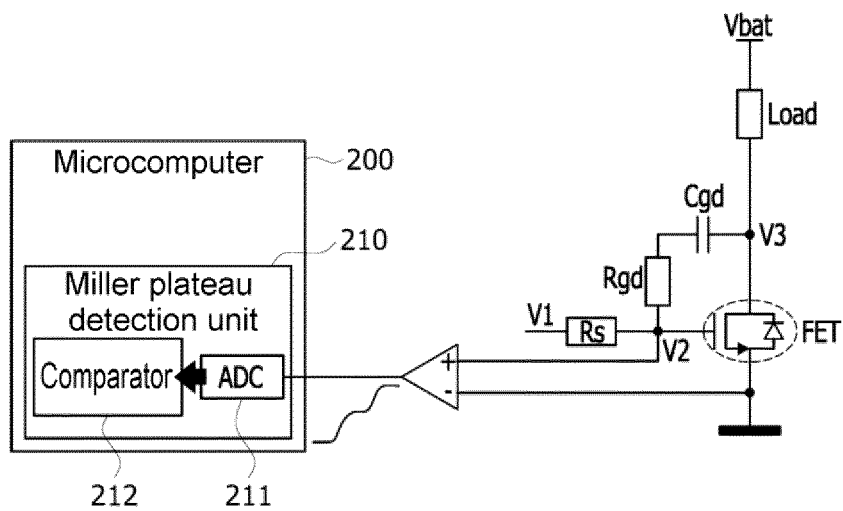
FIG. 5 is an illustration schematically showing the configuration of another embodiment of an open circuit diagnosis apparatus for a motor drive circuit according to one embodiment of the present invention.

Meanwhile, FIG. 5 is an illustration schematically showing the configuration of another embodiment of an open circuit diagnosis apparatus for a motor drive circuit according to one embodiment of the present invention, wherein the microcomputer 200 or control unit may be implemented internally as a (software-based) Miller plateau detection unit 210. The Miller plateau detection unit 210 comprises: an AD converter ADC, 211 which continually receives input of the gate voltage of the switching element of the motor drive circuit and converts same into digital; and a comparator 212 which shapes a signal which is continually output from the AD converter ADC, 211, and the microcomputer 200 can determine whether the state is the open circuit state or the normal state by comparing the form of the signal shaped by the comparator 212 and the graph shown in FIG. 3 (graph of the gate voltage of the switching element).

Figure 6:
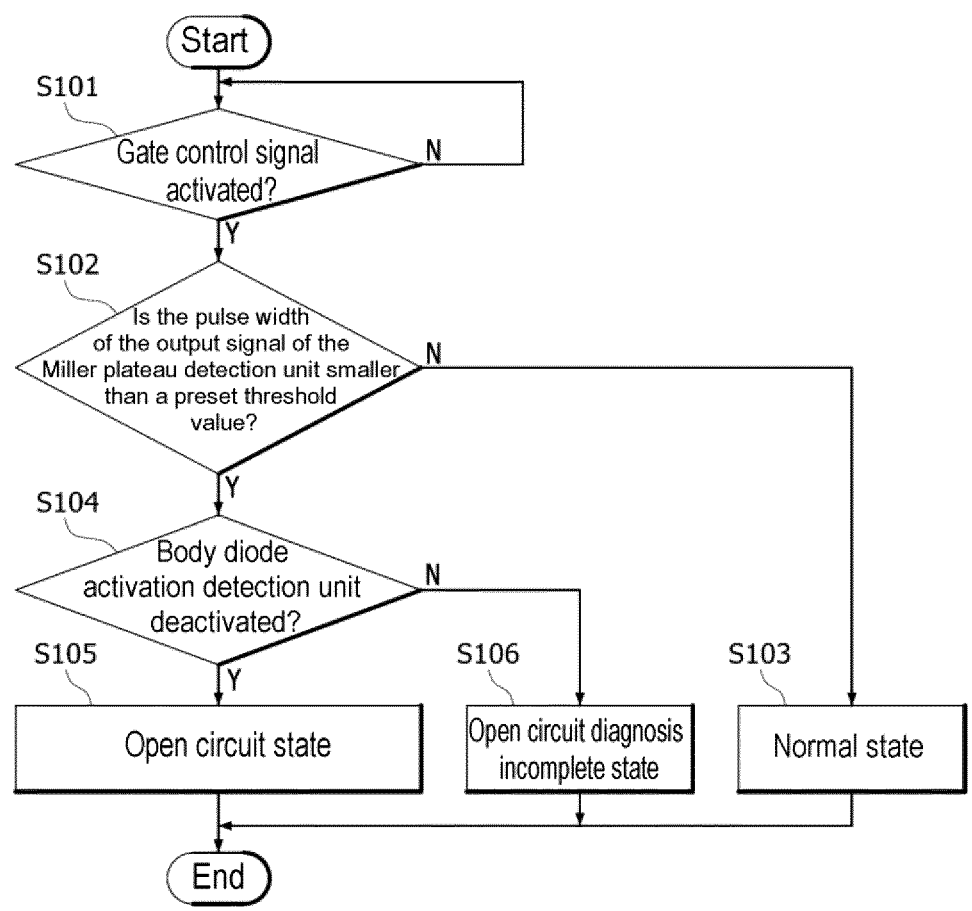
FIG. 6 is a flowchart showing and explaining the open circuit diagnosis method for a motor drive circuit according to one embodiment of the invention.

FIG. 6 is a flowchart showing and explaining the open circuit diagnosis method for a motor drive circuit according to one embodiment of the invention.

As shown in FIG. 6, when a gate control signal is applied to the switching element of the motor drive circuit (i.e. when the gate control signal of the switching element activates and turns on) YES in S101, the control unit 200 checks S102 whether the pulse width of the output signal of the Miller plateau detection unit 110 is smaller than a preset threshold value.

If the checking S102 result is that the pulse width of the output signal of the Miller plateau detection unit 110 is not smaller than the preset threshold value NO in S102, the control unit 200 determines S103 that the motor drive circuit is in the normal state (i.e. there is no open circuit).

Meanwhile, if the checking S102 result is that the pulse width of the output signal of the Miller plateau detection unit 110 is smaller than the preset threshold value YES in S102, the control unit 200 checks S104 whether the body diode activation detection unit 120 is in a deactivated state.

If the checking S104 result is that the body diode activation detection unit 120 is in the deactivated state YES in S104, the control unit 200 determines S105 that the motor drive circuit is in the open circuit state since the pulse width of the output signal of the Miller plateau detection unit 110 is smaller than the preset threshold value YES in S102 and the body diode activation detection unit 120 is in the deactivated state YES in S104.

If for any reason, the checking S104 result is that the body diode activation detection unit 120 is not in the deactivated state NO in S104, the control unit 200 determines S106 that the open circuit diagnosis of the motor drive circuit is still in an incomplete state since even though the pulse width of the output signal of the Miller plateau detection unit 110 is smaller than the preset threshold value YES in S102, the body diode activation detection unit 120 is in the activated state NO in S104 (i.e. a state in which a reverse current flows).

The present embodiment as described above has the effect in which open circuit diagnosis can be performed in a motor drive circuit (or motor drive IC) quickly and safely even during operation of a direct-current motor.

Although the present invention has been described with reference to the embodiments illustrated in the drawings, this is merely illustrative. It will be understood by those skilled in the art to which the present technology belongs that it is possible to implement various modifications and other equivalent embodiments based thereon. Therefore, the scope of technical protection of the present invention should be determined by the following claims. Furthermore, the embodiment described in the present specification can be realized as, for example, a method or process, apparatus, software program, data stream or signal. Despite being discussed only in the context of a single form of embodiment (for example, discussed only as a method), the embodiment of the discussed feature can be realized in another form (for example, an apparatus or program). The apparatus can be implemented as appropriate hardware, software and firmware etc. The method can be realized in apparatuses such as processors which are generally called processing devices which, for example, include computers, microprocessors, integrated circuits and programmable logic devices. Processors further include communication devices such as computers, cell phones, mobile/personal information terminals (personal digital assistants, PDA) and other devices which easily communicate information between end users.

The following is a summary list of reference numerals and the corresponding structure used in the above description of the invention:

110, 210 Miller plateau detection unit
111 First comparator
112 Second comparator
113 Third comparator
114 XOR operation unit
120 Body diode activation detection unit
121 Fourth comparator
122 Fifth comparator
B-diode Body diode
FET Switching element
200 Microcomputer
211 AD converter
212 Comparator

The invention claimed is:

1. An open circuit diagnosis apparatus for a motor drive circuit, the apparatus comprising:
a Miller plateau detection unit configured to detect whether there is a Miller plateau region in a gate voltage applied to a switching element of a motor drive circuit when the switching element is turned on;
a body diode activation detection unit configured to detect whether a body diode of the switching element has been activated, which depends on an on/off state of the switching element; and
a control unit configured to determine whether the motor drive circuit is in an open circuit state based on whether the body diode activation unit has been activated and whether there is a Miller plateau region in the gate voltage.

2. The open circuit diagnosis apparatus according to claim 1, wherein said control unit is configured to determine that the motor drive circuit is in the open circuit state when the body diode activation detection unit is in the deactivated state and at the same time there is no Miller plateau region in the gate voltage.

3. The open circuit diagnosis apparatus according to claim 1, wherein said Miller plateau detection unit comprises:
a first comparator configured to detect the voltage difference between the gate and the source of the switching element;

a second comparator configured to compare the output level of the first comparator with a predetermined first threshold value;

a third comparator configured to compare the output level of the first comparator with a predetermined second threshold value; and an XOR operation unit configured to receive the output values of said second and third comparators to determine and output an exclusive OR logic operation.

4. The open circuit diagnosis apparatus according to claim 1, wherein said Miller plateau region is a voltage waveform region in which there is a gate voltage when the switching element is turned on, when there is an open circuit between the switching element and a motor load.

5. The open circuit diagnosis apparatus according to claim 1, wherein said Miller plateau detection unit is configured to compare a gate voltage of the switching element with a pre-defined reference.

6. The open circuit diagnosis apparatus according to claim 1, wherein said Miller plateau detection unit is a circuit configured to output a pulse that corresponds to times at which predesignated upper and lower threshold values of the Miller plateau region are detected.

7. The open circuit diagnosis apparatus according to claim 6, wherein when there is an open circuit between the switching element and a motor load, there is no Miller plateau region in the gate voltage when the switching element is turned on, and consequently the Miller plateau detection unit outputs a pulse in which the width of the pulse which corresponds with the times at which said predesignated upper and lower threshold values are detected is narrower than a predesignated value.

8. The open circuit diagnosis apparatus according to claim 6, wherein said predesignated upper and lower threshold values are set to correspond with the Miller plateau region depending on the type of switching element.

9. The open circuit diagnosis apparatus according to claim 1, wherein:

said control unit is configured to determine the motor drive circuit to be in a normal state in which there is not an open circuit, when the width of the pulse output from the Miller plateau detection unit is the same as a width of a predesignated pulse within an error range, and said control unit is configured to determine an open circuit state, when the width of the pulse output from the Miller plateau detection unit is narrower than said width of said predesignated pulse.

10. The open circuit diagnosis apparatus according to claim 1, wherein said body diode activation detection unit is configured to detect an activation of a diode formed between a source and a drain of said switching element.

11. The open circuit diagnosis apparatus according to claim 10, wherein said body diode activation detection unit comprises:

a comparator configured to detect a voltage difference between said source and said drain; and another comparator configured to compare an output level of said comparator with a predetermined reference value and to output results of the comparison.

12. The open circuit diagnosis apparatus for a motor drive circuit according to claim 1, wherein said control unit is a software-based Miller plateau detection unit, and the software-based Miller plateau detection unit comprises:

an AD converter configured to continually receive input of the gate voltage of the switching element of the motor drive circuit and convert the gate voltage into digital; and a comparator configured to shape a signal which is continually output from the AD converter, and said comparator being configured to determine whether there is an open circuit by comparing the form of the signal shaped by the comparator and a pre-stored graph form of the gate voltage of the switching element.

13. A method for open circuit diagnosis for a motor drive circuit, the method comprising:

turning on a switching element of the motor drive circuit by applying a gate control signal to the switching element, and checking via a control unit whether a pulse width of an output signal of a Miller plateau detection unit is smaller than a preset threshold value;

if the pulse width of the output signal of the Miller plateau detection unit is smaller than the preset threshold value, checking via the control unit whether a body diode activation detection unit is in a deactivated state; and when the pulse width of the output signal of the Miller plateau detection unit is smaller than the preset threshold value and the body diode activation detection unit is in the deactivated state, determining via the control unit that the motor drive circuit is in the open circuit state.

14. The method according to claim 13, the method further comprises determining via the control unit that the motor drive circuit is in the normal state when the pulse width of the output signal of the Miller plateau detection unit is not smaller than the preset threshold value.

15. The method according to claim 13, the method further comprises determining via the control unit that the open circuit diagnosis of the motor drive circuit is still in an incomplete state when the body diode activation detection unit is in the activated state even though the pulse width of the output signal of the Miller plateau detection unit is smaller than the preset threshold value.

* * * * *